US012363868B2

(12) United States Patent
Crittenden et al.

(10) Patent No.: US 12,363,868 B2
(45) Date of Patent: *Jul. 15, 2025

(54) SERVICE SWITCH FOR UTILITY METER

(71) Applicant: ACLARA TECHNOLOGIES LLC, St. Louis, MO (US)

(72) Inventors: Curtis Crittenden, Milton, NH (US); Wayne Therrien, Rochester, NH (US); Thomas McDougall, Somersworth, NH (US)

(73) Assignee: Hubbell Incorporated, Shelton, CT (US)

( * ) Notice: Subject to any disclaimer, the term of this patent is extended or adjusted under 35 U.S.C. 154(b) by 222 days.

This patent is subject to a terminal disclaimer.

(21) Appl. No.: 18/086,489

(22) Filed: Dec. 21, 2022

(65) Prior Publication Data

US 2023/0127324 A1 Apr. 27, 2023

Related U.S. Application Data

(63) Continuation of application No. 16/875,888, filed on May 15, 2020, now Pat. No. 11,564,332.

(Continued)

(51) Int. Cl.
*H05K 7/20* (2006.01)
*G01R 11/02* (2006.01)
(Continued)

(52) U.S. Cl.
CPC .......... *H05K 7/2039* (2013.01); *G01R 11/02* (2013.01); *G01R 11/04* (2013.01); *H01F 27/22* (2013.01);
(Continued)

(58) Field of Classification Search
CPC . H02B 1/03; H02B 1/56; G01R 11/02; G01R 22/061; G01R 11/04; G01R 22/065; H01F 27/22; H05K 7/2039; H01R 13/6666
See application file for complete search history.

(56) References Cited

U.S. PATENT DOCUMENTS 4,901,187 A  2/1990  Allina
4,931,895 A  6/1990  Allina
(Continued)

OTHER PUBLICATIONS

Kim, C.H. and Park, B. High-performance stacked-coil transformers with thick metal layers. Electron. Lett., vol. 50, pp. 1359-1361, Sep. 2014, https://doi.org/10.1049/el.2014.2502 (Year: 2014).*

(Continued)

*Primary Examiner* — Robert J Hoffberg
(74) *Attorney, Agent, or Firm* — Robinson + Cole LLP

(57) ABSTRACT

A utility meter includes an electrical conductor portion, a service switch, and a heat sink. The electrical conductor portion provides electrical communication between a supply line terminal and a load line terminal, and the supply line terminal electrical communication an electrical source. The service switch is selectively operable to interrupt electrical communication between the supply line terminal and the load line terminal. The heat sink is in thermal communication with the electrical conductor portion to dissipate heat generated by a current passing through the electrical conductor portion between the supply line terminal and the load line terminal.

18 Claims, 5 Drawing Sheets

Related U.S. Application Data

(60) Provisional application No. 62/849,471, filed on May 17, 2019.

(51) Int. Cl.
    *G01R 11/04*     (2006.01)
    *H01F 27/22*     (2006.01)
    *H01R 13/66*     (2006.01)
    *H02B 1/03*      (2006.01)
    *H02B 1/56*      (2006.01)

(52) U.S. Cl.
    CPC ........... *H01R 13/6666* (2013.01); *H02B 1/03* (2013.01); *H02B 1/56* (2013.01)

(56) References Cited

U.S. PATENT DOCUMENTS

| | | |
|---|---|---|
| 5,933,004 A | 8/1999 | Jackson et al. |
| 5,966,010 A | 10/1999 | Loy et al. |
| 6,104,586 A | 8/2000 | Robinson |
| 6,549,388 B2 | 4/2003 | Robinson |
| 6,836,108 B1 | 12/2004 | Balko et al. |
| 7,009,379 B2 | 3/2006 | Ramirez |
| 7,253,605 B2 | 8/2007 | Burns et al. |
| 7,274,187 B2 | 9/2007 | Loy |
| 7,336,477 B2 | 2/2008 | Weister et al. |
| 8,040,664 B2 | 10/2011 | Makinson et al. |
| 8,564,280 B2 | 10/2013 | Loy |
| 9,017,093 B1 | 4/2015 | Packard, III et al. |
| 9,024,621 B2 | 5/2015 | Nahar |
| 9,714,965 B2 | 7/2017 | Crittenden |
| 9,829,517 B2 | 11/2017 | Voisine et al. |
| 11,564,332 B2 * | 1/2023 | Crittenden ............. G01R 11/02 |
| 2001/0021605 A1 | 9/2001 | Bolam |
| 2007/0041148 A1 | 2/2007 | Weister et al. |
| 2007/0117436 A1 | 5/2007 | Davis |
| 2012/0126793 A1 | 5/2012 | Loy et al. |
| 2013/0098744 A1 | 4/2013 | Therrien et al. |
| 2015/0338443 A1 | 11/2015 | Rohr et al. |
| 2023/0107831 A1 * | 4/2023 | Bentley ................ H01R 13/502 439/487 |

OTHER PUBLICATIONS

Notification of Transmittal of the International Search Report and the Written Opinion of the International Searching Authority (Forms PCT/ISA/220, PCT/ISA/210, and PCT/ISA/237) issued on Aug. 7, 2020, by the International Searching Authority in corresponding International Patent Application No. PCT/US2020/033278. (11 pages).

* cited by examiner

SERVICE SWITCH FOR UTILITY METER

REFERENCE TO RELATED APPLICATIONS

This application is a continuation of co-pending U.S. patent application Ser. No. 16/875,888, filed May 15, 2020, which claims the benefit of U.S. Provisional Patent Application No. 62/849,471, filed May 17, 2019. The entire contents of these applications are incorporated by reference.

FIELD

The present disclosure relates to a utility meter, and particularly to a utility meter having a service switch and one or more heat dissipation features.

SUMMARY

In one independent aspect, a utility meter includes an electrical conductor portion, a service switch, and a heat sink. The electrical conductor portion provides electrical communication between a supply line terminal and a load line terminal, and the supply line terminal electrical communication an electrical source. The service switch is selectively operable to interrupt electrical communication between the supply line terminal and the load line terminal. The heat sink is in thermal communication with the electrical conductor portion to dissipate heat generated by a current passing through the electrical conductor portion between the supply line terminal and the load line terminal.

In some aspects, the electrical conductor portion is a first electrical conductor portion, the supply line terminal is a first supply line terminal, and the load line terminal is a first load line terminal, and the utility meter further includes a second electrical conductor portion providing electrical communication between a second supply line terminal and a second load line terminal, and the service switch is selectively operable to interrupt electrical communication between the first supply line terminal and the first load line terminal and also selectively operable to interrupt electrical communication between the second supply line terminal and the second load line terminal.

In some aspects, the first electrical conductor portion carries a current having a first phase and the second electrical conductor portion carries a current having a second phase different from the first phase.

In some aspects, the heat sink is a first heat sink, and the utility meter further includes a second heat sink in thermal communication with the second electrical conductor portion to dissipate heat generated by a current passing through the second electrical conductor portion between the second supply line terminal and the second load line terminal.

In some aspects, the utility meter further includes a base supporting the service switch and the heat sink, wherein the service switch is positioned adjacent a first side of the base and the heat sink is positioned adjacent a second side of the base opposite the first side.

In some aspects, the utility meter further includes a current transformer positioned adjacent one of the supply line terminal and the load line terminal, and the current transformer is positioned in a recess.

In some aspects, the utility meter further includes a current transformer positioned adjacent one of the supply line terminal and the load line terminal, and the current transformer includes a stacked coil extending around the one of the supply line terminal and the load line terminal, the coil oriented parallel to a base supporting the supply line terminal and the load line terminal.

In some aspects, the heat sink includes a flat plate and a plurality of holes passing through the flat plate.

In some aspects, the supply line terminal includes a supply line blade configured to engage a first socket, and the load line terminal includes a load line blade configured to engage a second socket.

In another independent aspect, a utility meter includes a first electrical conductor portion, a second electrical conductor portion, a service switch, a first heat sink, and a second heat sink. The first electrical conductor portion provides electrical communication between a first supply line terminal and a first load line terminal, and the first supply line terminal electrical communication an electrical source. The second electrical conductor portion provides electrical communication between a second supply line terminal and a second load line terminal, and the second supply line terminal is in electrical communication with an electrical source. The service switch is selectively operable to interrupt electrical communication between the first supply line terminal and the first load line terminal, and to interrupt electrical communication between the first supply line terminal and the first load line terminal. The first heat sink is in thermal communication with the first electrical conductor portion to dissipate heat generated by a current passing through the first conductor portion between the supply line terminal and the load line terminal. The second heat sink is in thermal communication with the second electrical conductor portion to dissipate heat generated by a current passing through the second electrical conductor portion between the second supply line terminal and the second load line terminal.

In some aspects, the first electrical conductor portion carries a current having a first phase and the second electrical conductor portion carries a current having a second phase different from the first phase.

In some aspects, the utility meter further includes a base supporting the service switch and the heat sink, wherein the service switch is positioned adjacent a first side of the base and the heat sink is positioned adjacent a second side of the base opposite the first side.

In some aspects, the utility meter further includes a pair of current transformers, each of the current transformers positioned adjacent an associated one of the first load line terminal and the second load line terminal, each of the current transformers positioned in an associated recess.

In some aspects, the utility meter further includes a current transformer including a stacked coil extending around one of the first supply line terminal and the first load line terminal, the coil oriented parallel to a base supporting the supply line terminal and the load line terminal.

In some aspects, the first heat sink is a different type of heat sink than the second heat sink.

In some aspects, at least one of the first heat sink and the second heat sink includes a flat plate and a plurality of holes passing through the flat plate.

In some aspects, the first supply line terminal includes a first blade configured to engage a first socket, and the second supply line terminal includes a second blade configured to engage a second socket.

Other aspects will become apparent by consideration of the detailed description and accompanying drawings.

DETAILED DESCRIPTION

Before any embodiments are explained in detail, it is to be understood that the disclosure is not limited in its application to the details of construction and the arrangement of components set forth in the following description or illustrated in the following drawings. The disclosure is capable of other embodiments and of being practiced or of being carried out in various ways. Also, it is to be understood that the phraseology and terminology used herein is for the purpose of description and should not be regarded as limiting. Use of "including" and "comprising" and variations thereof as used herein is meant to encompass the items listed thereafter and equivalents thereof as well as additional items. Use of "consisting of" and variations thereof as used herein is meant to encompass only the items listed thereafter and equivalents thereof. Unless specified or limited otherwise, the terms "mounted," "connected," "supported," and "coupled" and variations thereof are used broadly and encompass both direct and indirect mountings, connections, supports, and couplings.

Figure 1:
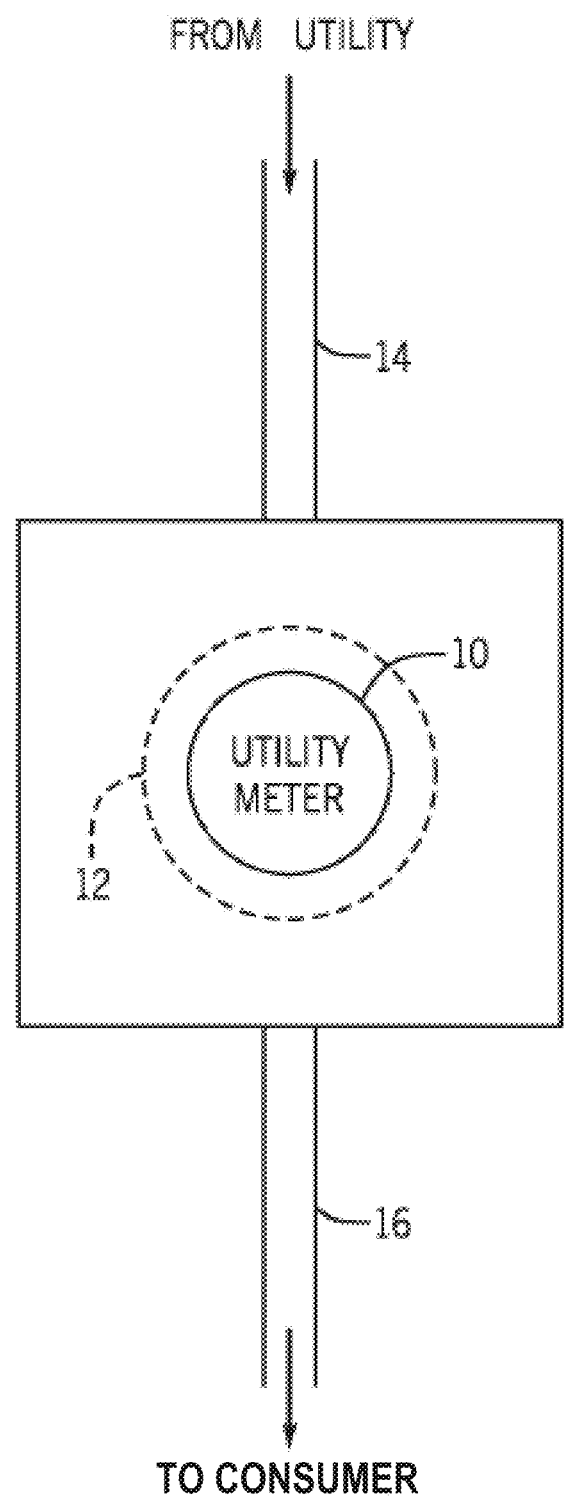
FIG. 1 is a diagram of a utility service line and a utility meter.
Figure 2:
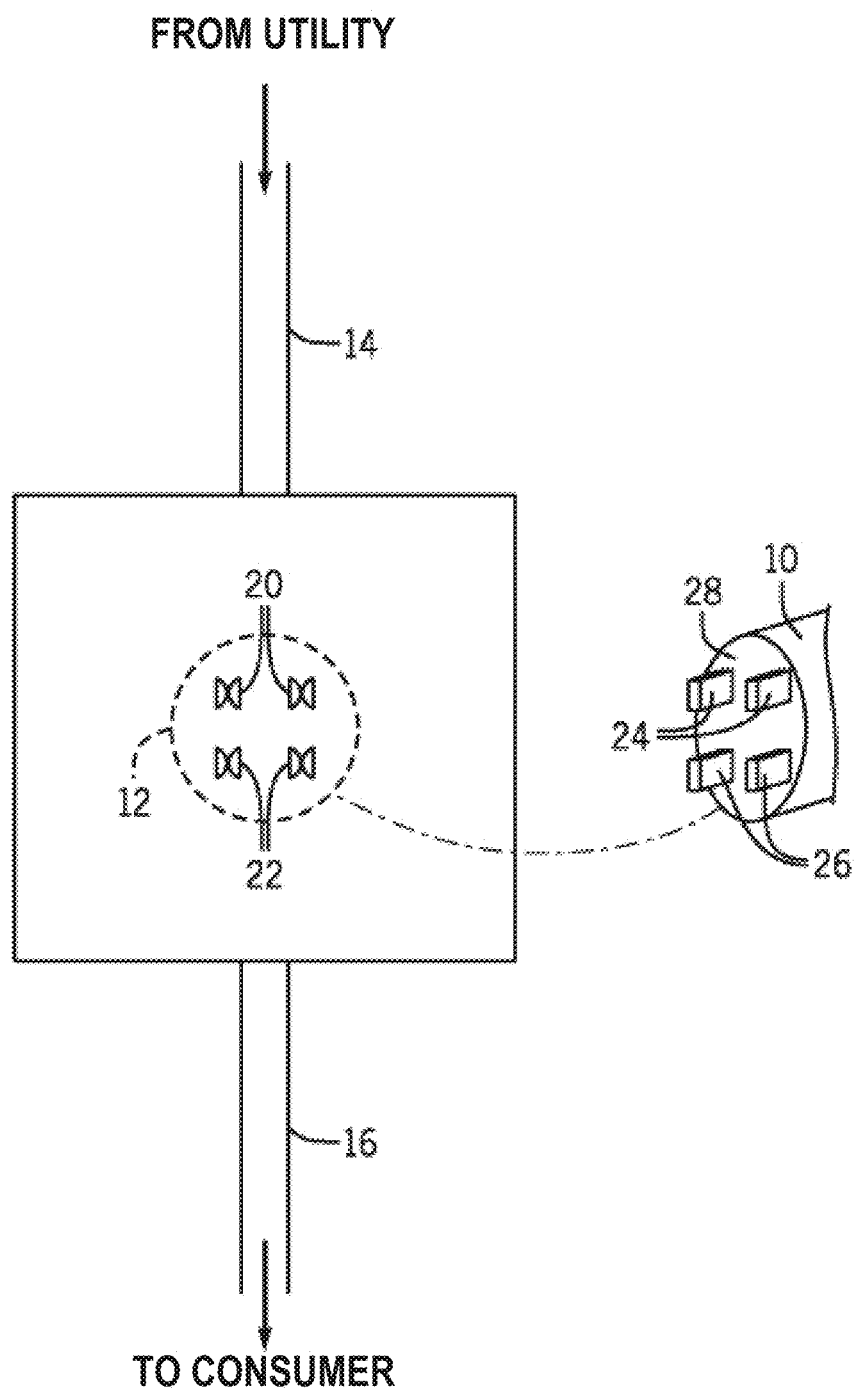
FIG. 2 is a diagram of a utility service line and a utility meter, with the utility meter in a disconnected position.

FIGS. 1 and 2 illustrate a utility meter 10 that can be coupled to a utility socket 12. The utility socket 12 is coupled to a utility service line including a supply line 14 and a load line 16. As shown in FIG. 2, in the illustrated embodiment, the utility socket 12 includes a pair of first socket terminals 20 that are in electrical communication with the supply line 14, and a pair of second socket terminals 22 that are in electrical communication with the load line 16. Similarly, the utility meter 10 includes a pair of first meter terminals 24 and a pair of second meter terminals 26. The first meter terminals 24 are engageable with the first socket terminals 20 of the socket 12, while the second meter terminals 26 are engageable with the second socket terminals 22 of the socket 12. In the illustrated embodiment, each of the socket terminals 20, 22 is a jaw-type connector, and each of the meter terminals 24, 26 is a blade that is received between the jaw of the associated socket terminal.

Figure 3:
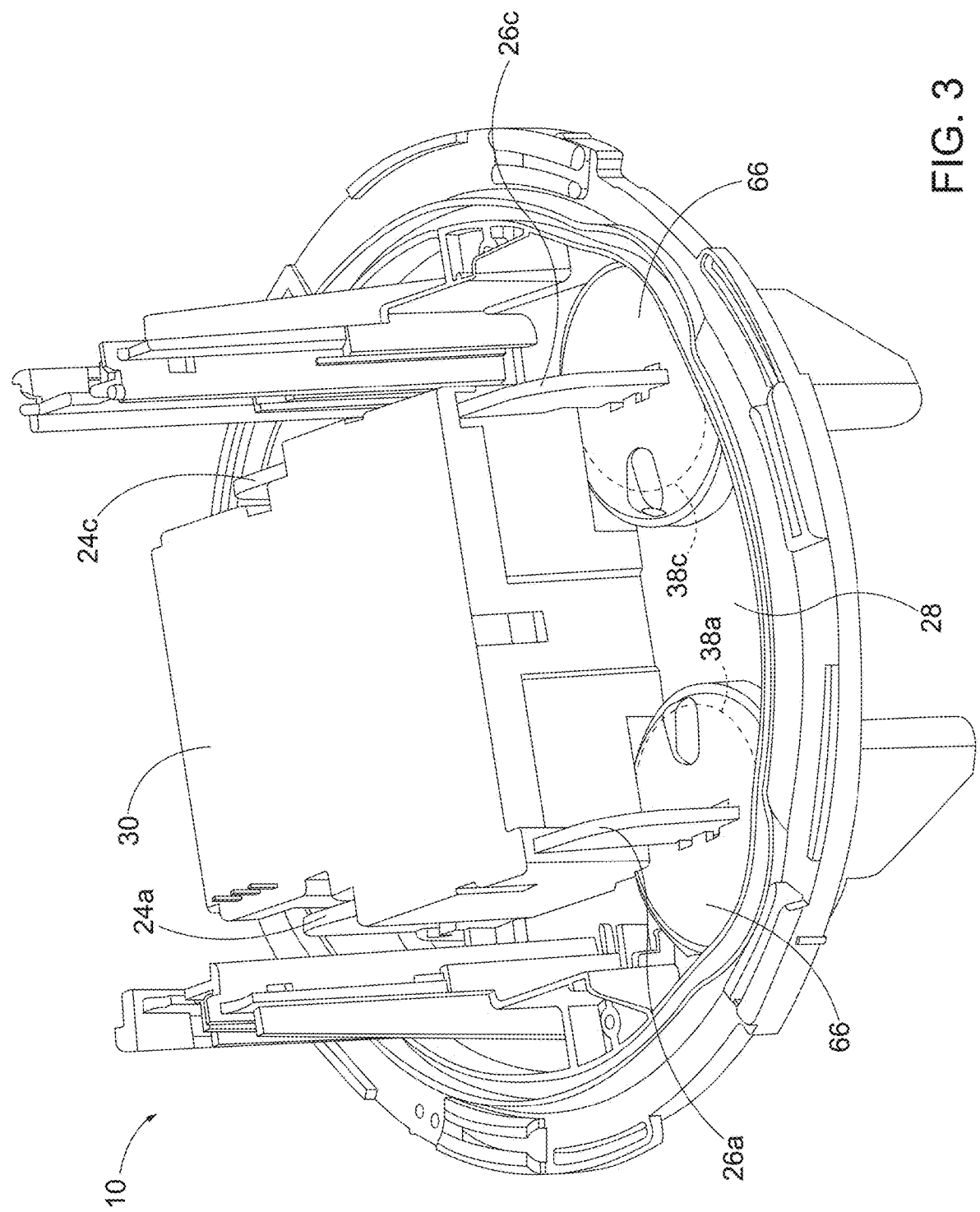
FIG. 3 is a perspective view of one side of a utility meter.
Figure 4:
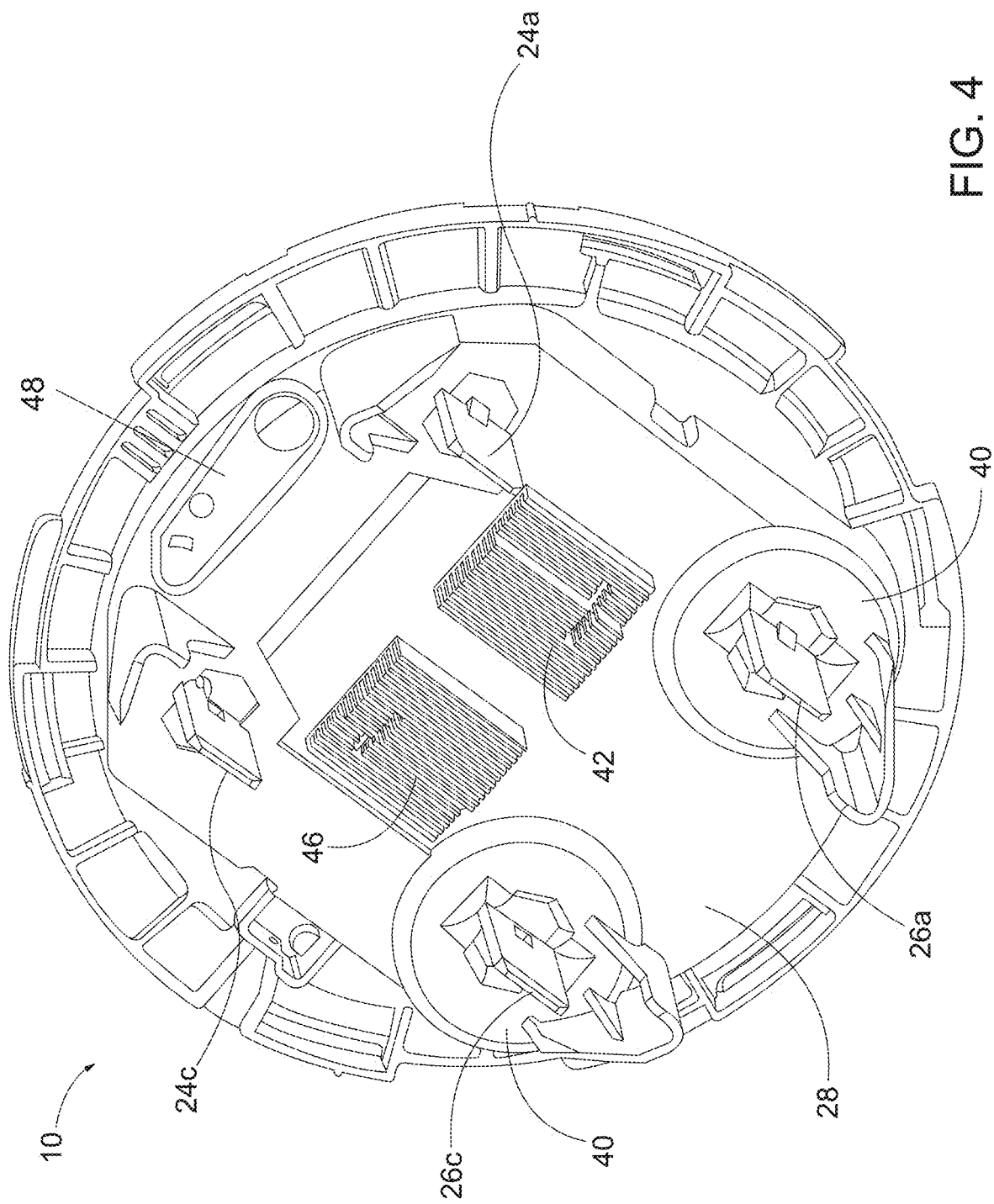
FIG. 4 is a perspective view of another side of the utility meter of FIG. 3.

As shown in FIG. 3, the utility meter 10 also includes a relay or service switch 30 positioned on a meter body or base 28. In some embodiments, the service switch 30 can be actuated to selectively interrupt or disconnect electrical communication between the supply line 14 and the load line 16, and/or may be operable to limit current passing to the load line 16. Referring to FIG. 4, the first meter terminals 24 include a phase A supply line terminal 24a and a phase C supply line terminal 24c. The second meter terminals 26 include a phase A load line terminal 26a and a phase C load line terminal 26c. The service switch 30 is connected between the supply line terminals 24 and the load line terminals 26. In some embodiments, the service switch 30 can be actuated remotely to disconnect and connect the supply line 14 and the load line 16.

Figure 5:
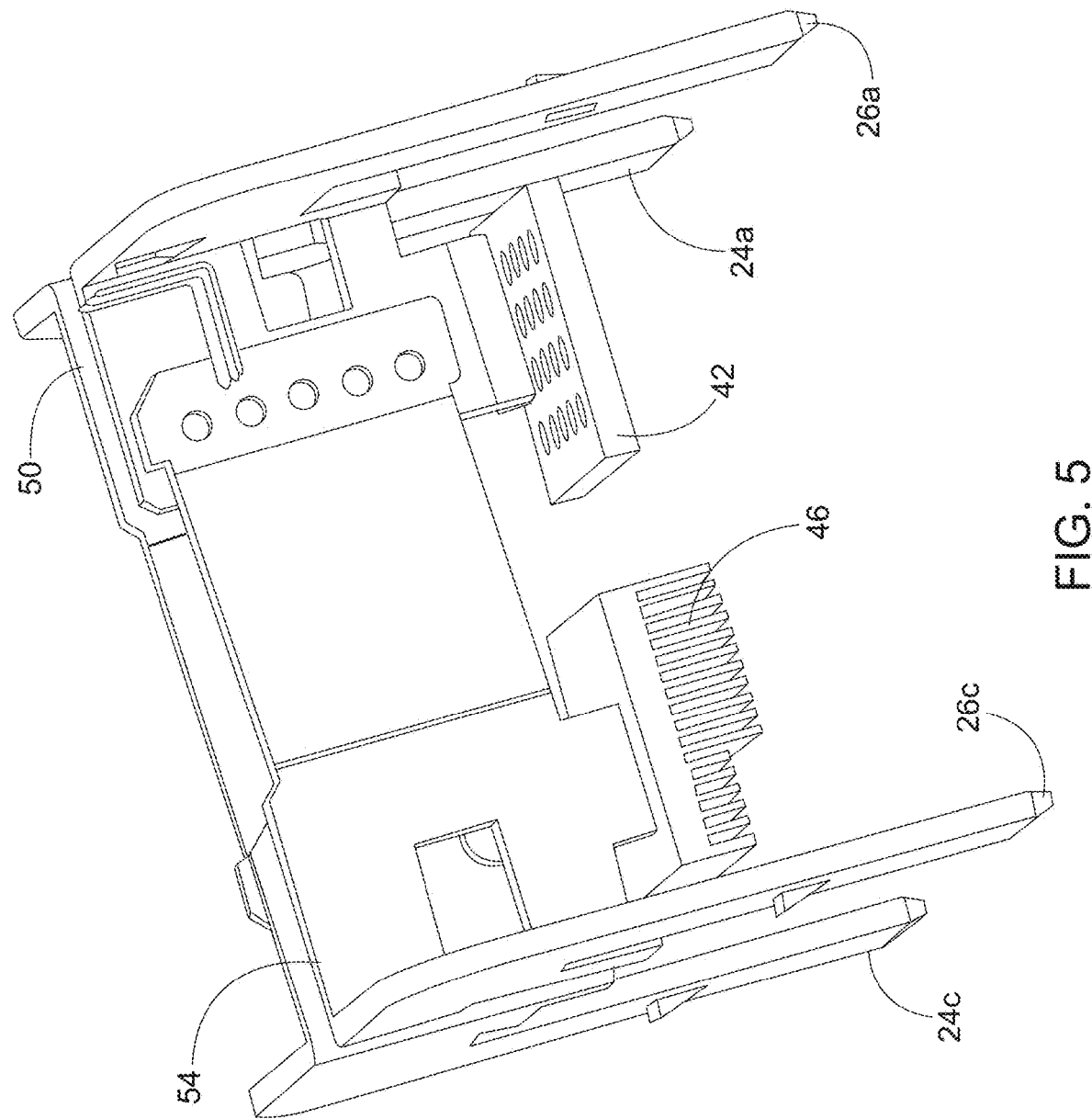
FIG. 5 is a perspective view of electrical conductors and heat sinks.

As shown in FIGS. 4 and 5, a first heat sink 42 is positioned adjacent a side of the meter body 28 (FIG. 4) that is opposite the service switch 30. In the illustrated embodiment, a meter hanger 48 (FIG. 4) is positioned adjacent the same side of the body 28 as the heat sink 42. The first heat sink 42 is in thermal communication with a conductor 50 (FIG. 5) through which current passes between the phase A supply line terminal 24a and the phase A load line terminal 26a (e.g., phase A current). Similarly, a second heat sink 46 is positioned adjacent a side of the meter body 28 (FIG. 4) that is opposite the service switch 30. The second heat sink 46 is in thermal communication with a conductor 54 (FIG. 5) through which current passes between the phase C supply line terminal 24c and the phase C load line terminal 26c (e.g., phase C current).

Referring now to FIG. 3, a current transformer or coil 38 is positioned adjacent each of the load line terminals 26a, 26c. In particular, a current transformer 38a is positioned adjacent the phase A load line terminal 26a, and a current transformer 38c is positioned adjacent the phase C load line terminal 26c. In the illustrated embodiment, the current transformers 38 are positioned in a plane that is parallel to the meter base 28 and positioned away from a front of the meter 10. In addition, the current transformers 38 are positioned in pockets or recesses 40 (FIG. 4) in the base 28, and covers 66 are positioned over sides of the current transformers 38 to further increase the magnetic shielding.

As shown in FIG. 5, in some embodiments, the first heat sink 42 is a finned heat sink and the second heat sink 46 is a flat plate heat sink having a plurality of holes for increasing surface area. In other embodiments, both heat sinks 42, 46 may be the same type. Also, in other embodiments, one or more of the heat sinks 42, 46 may be a different type. In the illustrated embodiment, the heat sinks 42, 46 are formed from a metallic material; in other embodiments, the heat sinks may be formed from a different material (e.g., a thermally conductive plastic). In addition, in some embodiments, the base 28 (or at least portions of the base 28) can be formed from a thermally conductive plastic and connected to the conductors 50, 54 and terminals 24, 26 by metal stock or heat pipes. Also, in the illustrated embodiment the heat sinks 42, 46 are positioned near a central portion of the base 28; in other embodiments, the heat sinks 42, 46 may be formed or embedded in a peripheral portion of the base 28 and extend along at least a portion of the perimeter.

The first heat sink 42 dissipates heat generated by the phase A current, while the second heat sink 46 dissipates heat generated by the phase C current. The heat sinks 42, 46 permit the service switch 30 to carry large currents (e.g., 320 A) by removing excess heat and maintaining the meter terminals 24, 26 within specified temperature limits. The heat sinks 42, 46 are positioned on an outer surface of the meter enclosure, thereby conveying the heat outside of the meter enclosure.

The embodiments described above and illustrated in the figures are presented by way of example only and are not intended as a limitation upon the concepts and principles presented herein. As such, it will be appreciated that variations and modifications exist within the scope and spirit of one or more independent aspects as described.

What is claimed is:

1. A utility meter comprising:
   an electrical conductor portion providing electrical communication between a supply line terminal and a load line terminal, the supply line terminal in electrical communication with an electrical source;
   a base having a first side and a second side opposite the first side;
   a current transformer positioned adjacent to one of the supply line terminal or the load line terminal, the current transformer positioned in a recess formed on the first side of the base;

a service switch positioned adjacent the first side of the base, the service switch selectively operable to interrupt the electrical communication between the supply line terminal and the load line terminal; and a heat sink positioned adjacent the second side of the base, the heat sink in thermal communication with the electrical conductor portion to dissipate heat generated by a current passing through the electrical conductor portion between the supply line terminal and the load line terminal.

2. The utility meter of claim 1, wherein the electrical conductor portion having the current passing therethrough is a first electrical conductor portion having a first current passing therethrough, the supply line terminal is a first supply line terminal, and the load line terminal is a first load line terminal, the utility meter further comprising a second electrical conductor portion providing electrical communication between a second supply line terminal and a second load line terminal, wherein the service switch is selectively operable to interrupt the electrical communication between the first supply line terminal and the first load line terminal and also selectively operable to interrupt the electrical communication between the second supply line terminal and the second load line terminal.

3. The utility meter of claim 2, wherein the first electrical conductor portion carries the first current having a first phase and the second electrical conductor portion carries a second current having a second phase different from the first phase.

4. The utility meter of claim 2, wherein the heat sink is a first heat sink, the utility meter further comprising a second heat sink in thermal communication with the second electrical conductor portion to dissipate heat generated by a second current passing through the second electrical conductor portion between the second supply line terminal and the second load line terminal.

5. The utility meter of claim 1 wherein the heat sink is spaced from the supply line terminal and the load line terminal.

6. The utility meter of claim 5, wherein a cover is positioned over the current transformer.

7. The utility meter of claim 1, wherein the current transformer includes a stacked coil extending around the one of the supply line terminal or the load line terminal, the stacked coil oriented parallel to the base supporting the supply line terminal and the load line terminal.

8. The utility meter of claim 1, wherein the heat sink includes a flat plate and a plurality of holes passing through the flat plate.

9. The utility meter of claim 1, wherein the supply line terminal includes a supply line blade configured to engage a first socket, and the load line terminal includes a load line blade configured to engage a second socket.

10. A utility meter comprising:
a first electrical conductor portion providing electrical communication between a first supply line terminal and a first load line terminal, the first supply line terminal in electrical communication with an electrical source;
a second electrical conductor portion providing electrical communication between a second supply line terminal and a second load line terminal, the second supply line terminal in electrical communication with the electrical source; a base having a first side and a second side opposite the first side;
a service switch positioned adjacent the first side of the base, the service switch selectively operable to interrupt the electrical communication between the first supply line terminal and the first load line terminal, and to interrupt the electrical communication between the second supply line terminal and the second load line terminal;
a first current transformer positioned adjacent to the first load line terminal, the first current transformer positioned in a first recess formed on the first side of the base;
a second current transformer positioned adjacent to the second load line terminal, the second current transformer positioned in a second recess formed on the first side of the base;
a first heat sink positioned adjacent the second side of the base, the first heat sink in thermal communication with the first electrical conductor portion to dissipate heat generated by a first current passing through the first electrical conductor portion between the first supply line terminal and the first load line terminal; and
a second heat sink positioned adjacent the second side of the base, the second heat sink in thermal communication with the second electrical conductor portion to dissipate heat generated by a second current passing through the second electrical conductor portion between the second supply line terminal and the second load line terminal.

11. The utility meter of claim 10, wherein the first current through the first electrical conductor portion has a first phase and the second current through the second electrical conductor portion has a second phase different from the first phase.

12. The utility meter of claim 10, wherein the first current transformer includes a stacked coil oriented parallel to the base supporting the first supply line terminal and the first load line terminal.

13. The utility meter of claim 10, wherein the first heat sink is a different type of heat sink than the second heat sink.

14. The utility meter of claim 10, wherein at least one of the first heat sink or the second heat sink includes a flat plate and a plurality of holes passing through the flat plate.

15. The utility meter of claim 10, wherein the first supply line terminal includes a first blade configured to engage a first socket, and the second supply line terminal includes a second blade configured to engage a second socket.

16. A utility meter comprising:
an electrical conductor portion providing electrical communication between a supply line terminal and a load line terminal, the supply line terminal in electrical communication with an electrical source;
a service switch selectively operable to interrupt the electrical communication between the supply line terminal and the load line terminal;
a heat sink extending from the electrical conductor portion to dissipate heat generated by a current passing through the electrical conductor portion between the supply line terminal and the load line terminal;
a base supporting the service switch and the heat sink, wherein the service switch is positioned adjacent to a first side of the base, and the heat sink is positioned adjacent to a second side of the base opposite the first side; and
a current transformer positioned adjacent to one of the supply line terminal or the load line terminal, the current transformer positioned in a recess formed in the first side of the base.

17. The utility meter of claim 16, wherein a cover is positioned over the current transformer.

18. The utility meter of claim 17, wherein the cover is positioned adjacent to the first side of the base.

\* \* \* \* \*